(12) United States Patent
Martinez et al.

(10) Patent No.: US 7,189,304 B2
(45) Date of Patent: Mar. 13, 2007

(54) SUBSTRATE LAYER CUTTING DEVICE AND METHOD

(75) Inventors: Muriel Martinez, St. Egreve (FR); Thierry Barge, Grenoble (FR); Alain Soubie, St. Egreve (FR); Chrystelle Lagahe-Blanchard, St. Joseph de Riviere (FR); Cécile Berne, Grenoble (FR); Olivier Rayssac, Grenoble (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 285 days.

(21) Appl. No.: 10/681,566

(22) Filed: Oct. 7, 2003

(65) Prior Publication Data

US 2004/0144487 A1    Jul. 29, 2004

Related U.S. Application Data

(63) Continuation of application No. PCT/FR02/01253, filed on Apr. 10, 2002.

(30) Foreign Application Priority Data

Apr. 10, 2001   (FR) ................................. 01 04937
Oct. 29, 2001   (FR) ................................. 01 13951

(51) Int. Cl.
   *B32B 38/10* (2006.01)
(52) U.S. Cl. ...................... 156/344; 156/584; 438/458; 83/468.1; 83/468.93
(58) Field of Classification Search ................ 438/458, 438/455; 156/344, 584; 83/468.1, 468.93
   See application file for complete search history.

(56) References Cited

U.S. PATENT DOCUMENTS

| 5,374,564 | A | 12/1994 | Bruel | 437/24 |
|---|---|---|---|---|
| 5,783,022 | A * | 7/1998 | Cha et al. | 156/344 |
| 5,897,743 | A * | 4/1999 | Fujimoto et al. | 156/584 |
| 6,050,255 | A | 4/2000 | Sievert | 125/23.01 |
| 6,077,383 | A * | 6/2000 | Laporte | 156/344 |
| 6,263,941 | B1 * | 7/2001 | Bryan et al. | 156/584 |
| 6,382,292 | B1 | 5/2002 | Ohmi et al. | 156/584 |
| 6,415,843 | B1 * | 7/2002 | De et al. | 156/584 |
| 6,418,999 | B1 | 7/2002 | Yanagita et al. | 156/584 |

(Continued)

FOREIGN PATENT DOCUMENTS

EP    0 989 593 A2    3/2000

(Continued)

*Primary Examiner*—Mark A. Osele
(74) *Attorney, Agent, or Firm*—Winston & Strawn LLP

(57) ABSTRACT

An automatic high-precision layer cutting device for separating a layer from a semiconductor substrate. The cutting device includes a fixed positioning member for receiving at least a portion of a semiconductor substrate that has a weakened area therein and a peripheral annular notch that is located below the weakened area. The positioning member maintains a predetermined position of the substrate on a support. The device also includes cutting means having at least one blade for contacting the substrate and for inducing a cleaving wave into the substrate. The cutting means is operatively associated with the positioning member so that the at least one blade contacts the annular notch and the positioning member prevents movement of the substrate. The at least one blade induces a cleaving wave of sufficient intensity to both divide the substrate at the notch into first and second parts and detach the layer from the substrate along the weakened area.

22 Claims, 7 Drawing Sheets

U.S. PATENT DOCUMENTS

| | | | |
|---|---|---|---|
| 6,427,747 B1 * | 8/2002 | Omi et al. | 156/584 |
| 6,427,748 B1 | 8/2002 | Yanagita et al. | 156/584 |
| 6,436,226 B1 * | 8/2002 | Omi et al. | 156/344 |
| 6,513,564 B2 * | 2/2003 | Bryan et al. | 156/584 |
| 6,609,553 B2 * | 8/2003 | Yanagita et al. | 156/584 |
| 6,653,205 B2 * | 11/2003 | Yanagita et al. | 438/455 |
| 6,833,312 B2 * | 12/2004 | Yanagita et al. | 438/459 |
| 6,844,242 B2 * | 1/2005 | Naruoka et al. | 438/455 |
| 6,979,629 B2 * | 12/2005 | Yanagita et al. | 438/458 |
| 2002/0174958 A1 * | 11/2002 | Yanagita et al. | 156/584 |
| 2002/0174959 A1 * | 11/2002 | Yanagita et al. | 156/584 |
| 2004/0029358 A1 * | 2/2004 | Park et al. | 438/458 |
| 2004/0137697 A1 * | 7/2004 | Tomita | 438/455 |
| 2005/0000649 A1 * | 1/2005 | Rayssac et al. | 156/344 |
| 2005/0164435 A1 * | 7/2005 | Park et al. | 438/162 |

FOREIGN PATENT DOCUMENTS

| | | |
|---|---|---|
| WO | WO 01/10644 | 2/2001 |
| WO | WO01/43168 | 6/2001 |

* cited by examiner

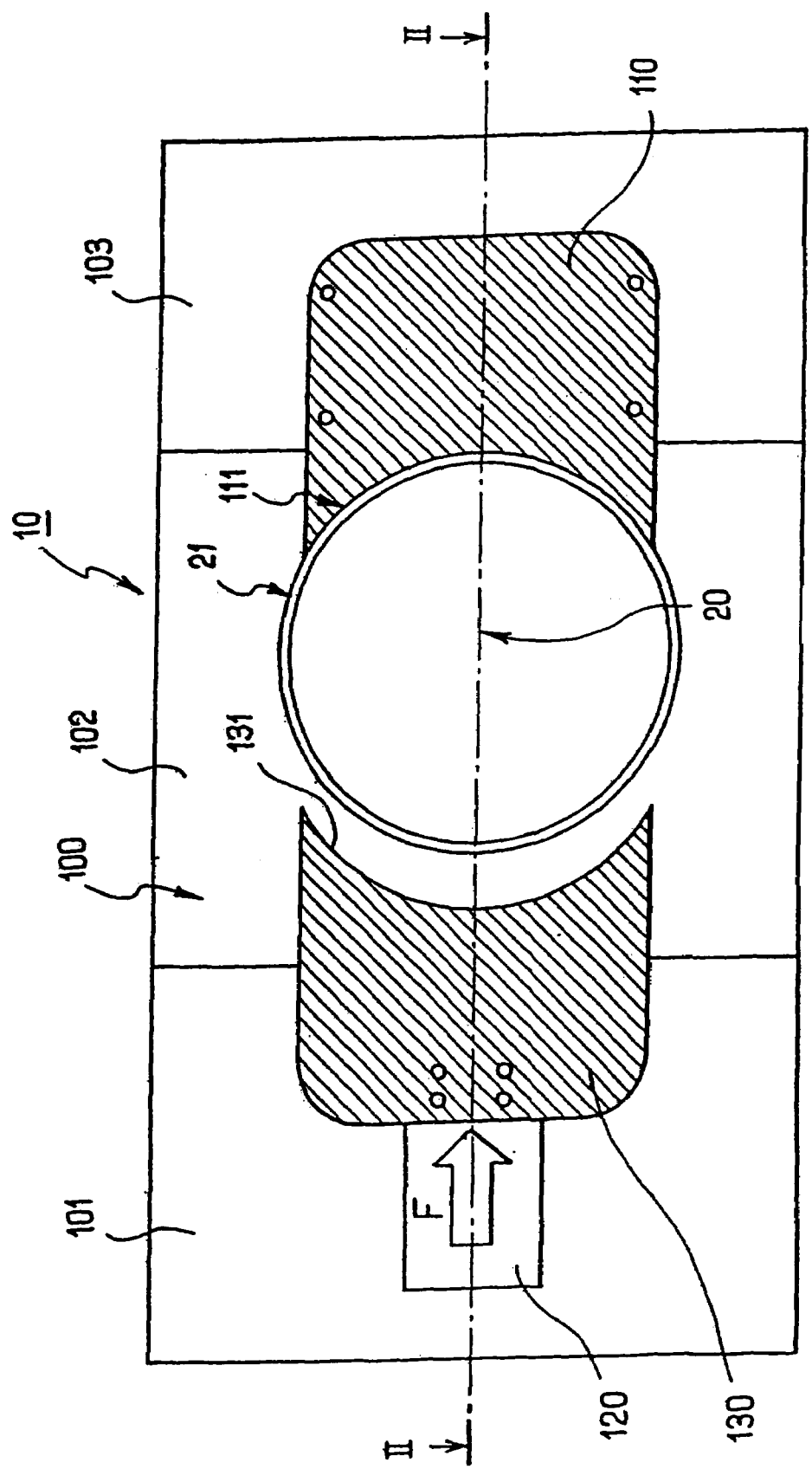
FIG_1

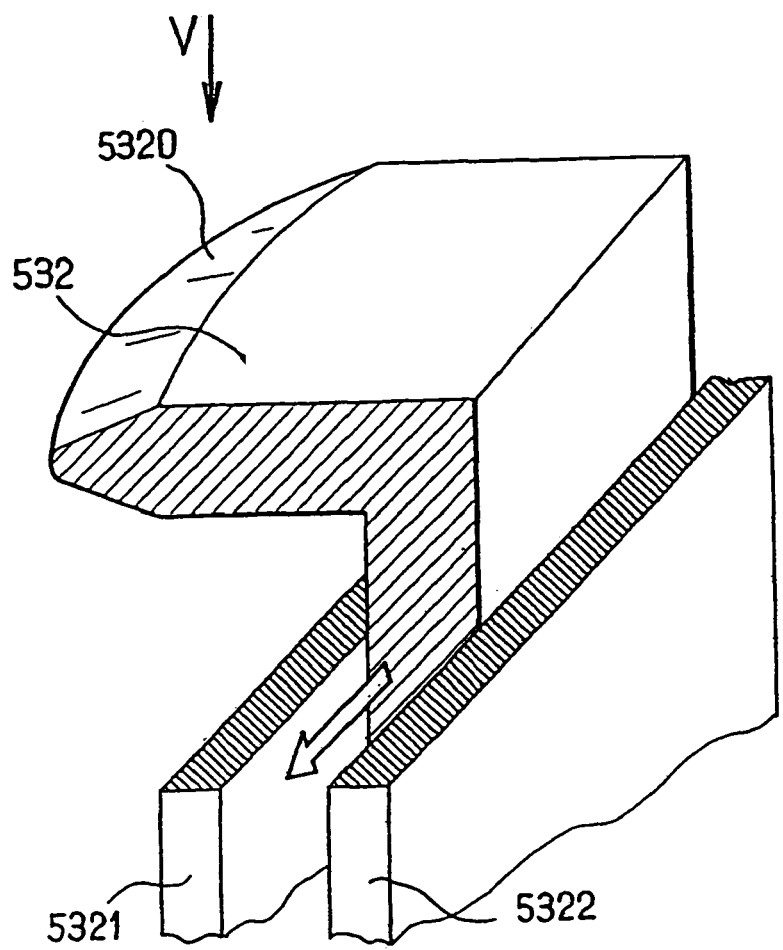
FIG_9
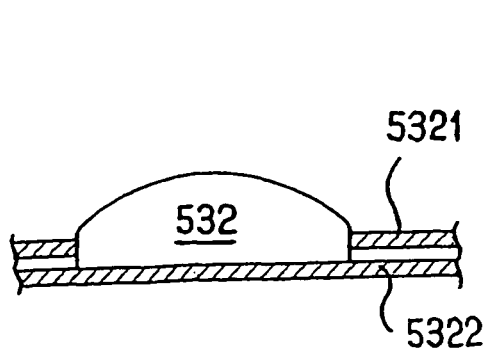
FIG_10a
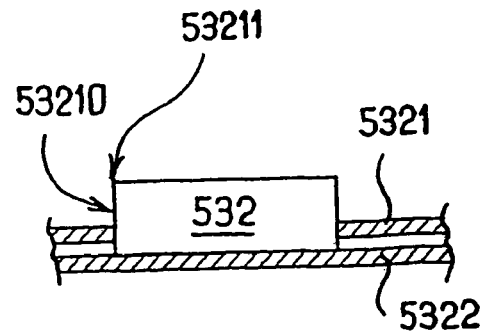
FIG_10b

SUBSTRATE LAYER CUTTING DEVICE AND METHOD

CROSS REFERENCE TO RELATED APPLICATIONS

This application is a continuation of International Application PCT/FR02/01253 filed Apr. 10, 2002, the entire content of which is expressly incorporated herein by reference thereto.

BACKGROUND

This invention generally relates to cutting layers of semiconductor materials from substrates that may be used for electronics, optics or optoelectronics. In particular, the invention relates to a device for automatic high-precision cutting of a semiconductor layer from a substrate that includes a weakened area and an annular notch. The device includes cutting means and means for maintaining the position of the assembly that includes the source substrate.

It is noted that "cutting" means dividing a single element, substrate or an assembly into two separate parts, and guaranteeing that the parts do not recombine. This type of cut is included within the framework of a substrate that includes a weakened area.

Substrates are usually in the form of disks called "wafers". Wafers may be made from a semi-conducting material such as silicon. It is known that a weakened area can be formed inside a wafer along a plane that is parallel to the principal faces of the wafer. The weakened area may be made by implantation of ions bombarded on the wafer surface. The ions create a weakened layer within the thickness of the wafer to delimit an upper region (in this text corresponding to the source substrate) and a lower region adjacent to the ion source (in this text corresponding to the layer that will be cut). U.S. Pat. No. 5,374,564 describes an example of such a process to make thin layers. Devices and processes are used to build up layers (thin or not) that may be transferred to a target support from a source substrate.

The weakened area can also be made by any known means. For example, an intermediate region made of porous materials can be built up between two regions of dense material, by forming an oxide layer buried in a substrate (for example an SOI (Silicon On Insulator) type substrate), or by bonding two layers, the bonding area corresponding to the weakened area.

A operator can manually make a cut at the weakened area to form two separate elements from the source substrate and the layer. But calling in an operator sets a limit to the layer production rate. Furthermore, it is not certain that the operation can be reproduced from substrate to substrate. Automatic cutting devices and processes are known to overcome the above-mentioned disadvantages. U.S. Pat. No. 6,418,999 describes one example of such a device and process. The device described in this patent uses a water jet impacting on the edge of a wafer held in place in two principal faces, to attack a weakened area and divide the wafer into two parts. But the design and operation of such a devices are relatively complex. In particular, a specific type of holder is necessary so that each of the two faces of the wafer are held to permit a given separation of the two parts of the wafer. Furthermore, the maintaining means or holder must also rotate the wafer so that its entire periphery is attacked by the water jet, which further increases the complexity of the design and operation of the device.

Document EP 989 593 also divulges a layer cutting device and process. But once again, a complex arrangement is necessary, in particular to maintain the position of the two parts of the wafer that are to be separated.

SUMMARY OF THE INVENTION

Presented is an automatic high-precision layer cutting device for separating a layer from a semiconductor substrate. The device includes a fixed positioning member for receiving at least a portion of a semiconductor substrate that has a weakened area therein and a peripheral annular notch that is located away from and preferably below the weakened area. The positioning member maintains a predetermined position of the substrate on a support. The device also includes cutting means having at least one blade for contacting the substrate and for inducing a cleaving wave into the substrate. The cutting means is operatively associated with the positioning member so that the at least one blade contacts the annular notch, and the positioning member prevents movement of the substrate, so that the at least one blade can induce a cleaving wave of sufficient intensity to both divide the substrate at the notch into first and second parts and detach the layer from the substrate along the weakened area.

In an advantageous embodiment, the positioning member of the device includes at least one shim, and may include a plurality of shims. The shape of the shim is preferably complementary to the shape of the semiconductor substrate. In addition, the at least one blade may be moveable toward and away from the positioning member, from a first position where the blade is retracted to allow positioning of the substrate in the device, and a second position wherein the blade contacts the annular notch. Preferably, the device further includes a movable support which supports the substrate prior to contact with the blade but which moves away from the substrate as the blade contacts the annular notch.

In another embodiment, the positioning member is affixed to a chassis. In a beneficial variant, the device includes a support substrate that is operatively associated with the positioning member so that the positioning member maintains the position of the semiconductor substrate in a cutting plane that is parallel to the at least one blade and the support member. In addition, a blade position adjustment element may be included for adjusting the blade along a direction perpendicular to the cutting plane so that the blade can be placed to contact the notch of substrates having different thicknesses. A movement member for displacing the blade by a predetermined translation in the cutting plane may also be included, and the movement member may control the blade to translate in at least one of a continuous manner or an intermittent manner to cut the substrate.

Advantageously, the tip of the blade of the device has a vertex angle on the order of 60°. The leading edge of the blade may also have a circular contour corresponding to a contour of the semiconductor substrate. Further, the blade leading edge may cover about one quarter of the periphery of the assembly. In a variant, the positioning member has an arcuate, preferably circular, contour that corresponds to the arcuate or circular contour of the semiconductor substrate.

An advantageous alternate embodiment according to the invention has a cutting means that includes a first cutting device and a second cutting device. This variant may also include a sensor capable of acquiring at least one parameter representing progress of a cutting operation by the first cutting device, and a trigger device to initiate use of the second cutting device when the parameter reaches a predetermined value. The parameter may be related to a measurement of the separation between layers being separated. In an implementation, the first cutting device comprises a first blade, and the second cutting device comprises second and third blades, and these blades are arranged symmetrically about the annular notch. In a beneficial arrangement, the second and third blades of the second cutting device are moveably mounted on second and third displacement devices, respectively, such that a leading edge of the second and third blades is oriented to tangentially attack the annular notch.

Another aspect of the invention concerns an automatic high-precision cutting method for separating a layer of material from a source substrate. The method includes positioning at least a portion of a semiconductor substrate that has a weakened area and a peripheral annular notch that is located below the weakened area, into a fixed positioning member which maintains the substrate in a predetermined position on a support. The method also includes contacting the substrate with a cutting means having at least one blade and inducing a cleaving wave into the substrate. The cutting means is operatively associated with the positioning member so that the at least one blade contacts the annular notch and the positioning member prevents movement of the substrate. In this manner, the at least one blade can induce a cleaving wave of sufficient intensity to both divide the substrate at the notch into first and second parts and detach the layer from the substrate along the weakened area.

In an advantageous embodiment, the method includes self-adjusting the relative positions of the substrate and the at least one blade along a direction perpendicular to the cutting plane as the blade contacts the notch, by cooperation between a cutting edge of the blade and the notch. Advantageously, the progress of the cleaving wave is monitored by analyzing light transmitted through the semiconductor substrate. Further, the method may include controlling the movements of the at least one blade with a displacement device depending on the monitored progress of the cleaving wave.

In a beneficial implementation, the method also includes monitoring at least one parameter representative of the progress of a cutting operation of a first cutting device during a first cutting phase, and controlling a second cutting device during a second cutting phase as a function of the monitored parameter.

In another advantageous implementation, the method includes attacking the substrate at a first location with a first cutting blade, and attacking the substrate at a second location a distance apart from the first location with at least a second cutting blade. In addition, the substrate may be attacked at a third location with a third cutting blade, wherein the first, second and third cutting blades are arranged symmetrically about the annular notch of the semiconductor substrate.

The invention thus overcomes the disadvantages associated with prior art devices by cutting layers, and in particular thin layers, in a reliable and simple manner. In addition, the device and method according to the invention cuts a wafer or substrate without damaging the corresponding surfaces of the cut layer and the substrate. Further, the invention permits precise control over cutting operation parameters to prevent damage to the wafers and to adapt the kinetics of the operation to different wafer types. The invention is particularly adapted to cutting of layers less than about a hundred microns thick, and particularly to cutting "thin" layers on the order of about 1 micron thick.

BRIEF DESCRIPTION OF THE DRAWINGS

Other aspects, purposes and advantages of the invention will become clear after reading the following detailed description with reference to the attached drawings, in which:

FIG. 1 is a diagrammatic top view of an assembly of a first embodiment of a cutting device according to the invention, and includes a section II—II;

FIG. 9 is a detailed view of a cutting means according to a second embodiment of the invention;

FIGS. 10a and 10b show a top view of two possible shapes of the cutting means of FIG. 9.

DETAILED DESCRIPTION OF THE PREFERRED EMBODIMENTS

Figure 2A:
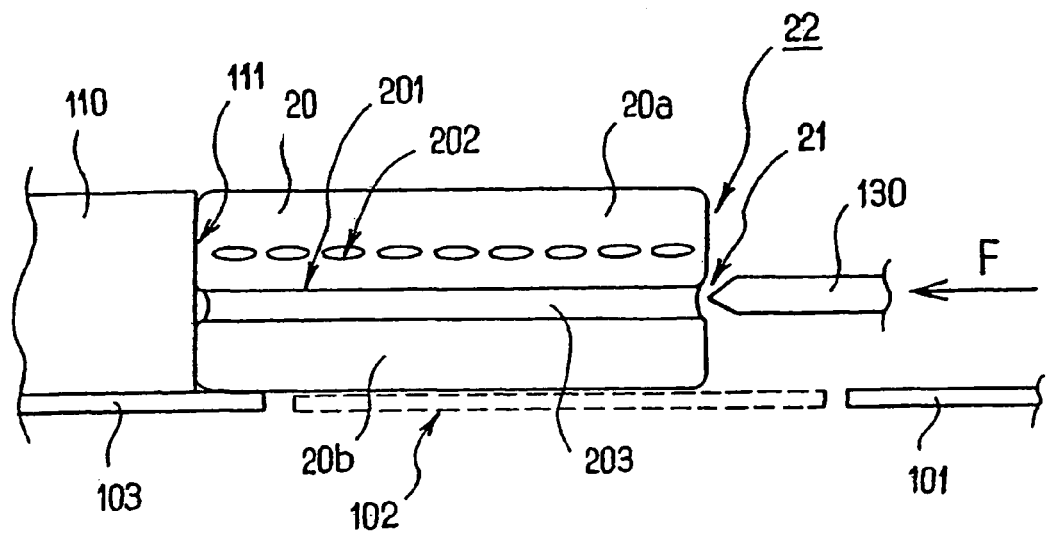
FIGS. 2a and 2b are sectional diagrammatic views along plane II—II of FIG. 1 of a wafer that includes a weakened area, placed in a cutting device like that shown in FIG. 1.

FIG. 1 is a top view of a cutting device 10 according to a first embodiment with a wafer 20 that is to be cut. The device 10 cuts a wafer layer along a cutting plane parallel to the faces of the wafer (in other words parallel to the horizontal plane of FIG. 1). The layer will thus be cut from the source substrate that forms a portion of the wafer 20. By convention, FIG. 1 is called a top view, and consequently, herein the vertical direction is the direction that is perpendicular to the median plane of the wafer.

The shape of the wafer 20 is a conventional circular shape. This wafer comprises a semiconductor substrate called the source substrate which may be made of silicon, the substrate itself including a weakened area like that described above. The weakened area extends along an intermediate plane of the wafer that is parallel to the principal faces of the wafer. The weakened area defines a layer in the substrate that will be detached from the wafer (for example to transfer this layer onto a target support).

Two concentric circles around the periphery of the wafer represent an annular chamfer 21 surrounding the wafer. For reasons of clarity, the separation between the two circles that represent the chamfer 21 have been shown at a relatively large scale compared with the scale used for the diameter of the wafer. This chamfer is located in the sidewall of the wafer, at a distance from the lower and upper faces of the wafer, and the purpose of the chamfer will be described below.

The wafer 20 is placed on the central part 102 of a fixed and plane chassis 100.

The chassis also supports a shim 110 or positioning member, and a displacement support 120 that has a blade 130 affixed to it. The shim 110 is fixed (for example by screws) on an end part 103 of the chassis 100, wherein the chassis 100 includes two end parts 101 and 103 on either side of the moveable central part 102. The shim 110 comprises a section 111 that is in contact with the sidewall of the wafer. The geometry of the section 111 is concave and circular, complementary to the section of the portion of the wafer that fits onto it. The section 111 forms a straight wall along the vertical direction (as can be seen clearly in FIGS. 2a and 2b). But this section 111 may have any other geometry or shape to cooperate with the with the wall of wafer 20 and to enable movement of the wafer in the vertical direction perpendicular to the cutting plane of the blade. In particular, this section 111 may have a slight notch or projection, to further facilitate self-adjustment of the position of the wafer relative to the device (this self-adjustment aspect will be described in detail below).

In the illustrative example of FIG. 1, section 111 of the shim thus covers slightly more than a quarter of the periphery of the wafer. In one variant, this section may cover a quarter of the periphery of the wafer. But in any case, this section must cover a sufficiently large part of the periphery of the wafer to maintain the position of the wafer being attacked by a blade (as will be described below). The wafer 20 was brought into contact and stopped by the wall section 111 of the shim, either by hand or by appropriate automatic handling means.

The displacement support 120 is fixed onto the part 101 of the fixed chassis 100. This support also supports the blade 130, and is operable to move the blade towards the wafer in translation (along the direction of arrow F). The blade 130 includes a leading edge section 131 that will attack the wafer. As shown in FIG. 1, like the section 111 of the shim, the geometry of the leading edge 131 is concave and circular. This circular shape is generally complementary to the geometry of the portion of the wafer that the blade will cut. However, note that the leading edge 131 is not necessarily circular, and its geometry could be any other shape. In an implementation, the blade attacks the wafer over approximately a quarter of the periphery of the wafer.

The wafer 20 is inserted between the shim 110 and the blade 130 installed on the displacement support 120. These elements are aligned, the shim and the blade being diametrically opposite the center of the wafer, and the blade is displaced along the F direction. The blade will attack the sidewall of the wafer at a required height. The position of the blade is adjustable in height to attack the said wall at the required height. For example, an adjustment can be made by an automatic device to adjust the position of the blade along the direction perpendicular to the cutting plane.

The displacement means 120 is capable of moving the blade to bring its leading edge 131 into contact with the sidewall of the wafer, and to penetrate into the wafer beyond the sidewall to a given depth. For example, the penetration depth may be on the order of one centimeter. However, the penetration depth may be defined as a function of parameters such as the shape of the blade section and the characteristics of the wafer (materials from which the wafer is made, shape of the annular chamfer, etc.). It is also noted that, although the penetration depth may be as much as about one centimeter, the width of the physical contact area between the wafer and the blade must not be more than a few millimeters (which corresponds to the width of the exclusion area).

Figure 11:
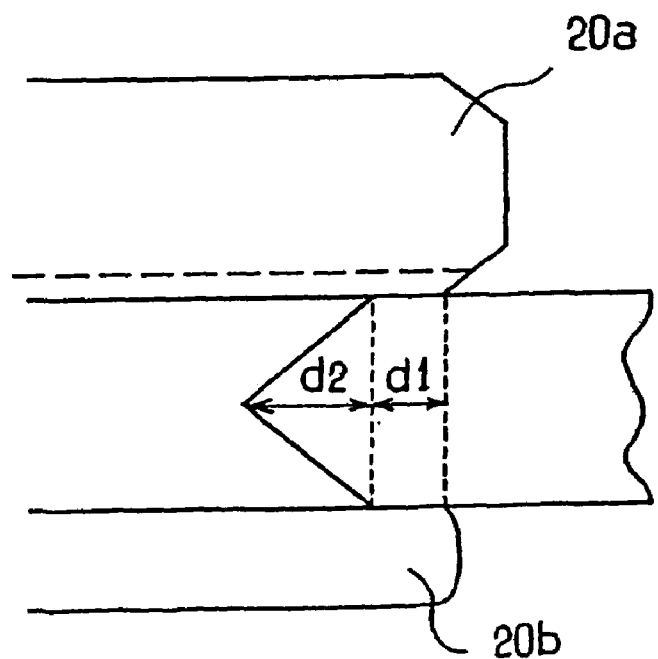
FIG. 11 diagrammatically illustrates the penetration of a blade in a wafer.

Therefore, the shape of the blade may be adapted, for example, to include a tip defined by two sloping faces that will penetrate into the wafer when the blade and the wafer are first brought into contact. The sloping faces of the blade act as a wedge to separate the two parts of the wafer from each other. In addition, the blade may include a constant thickness portion behind the tip, as shown in FIG. 11. This constant thickness portion is the only part of the blade that is in contact with the wafer after the tip has penetrated into the wafer. It holds the parts of the wafer at a controlled spacing from each other corresponding to the predetermined thickness of this part of the blade. This facilitates controlled cutting of the wafer. In this respect, note that it is important that the size of the physical contact area between the blade and the wafer be limited, since the blade must not come into contact with the central part of the wafer that is surrounded by the exclusion area (top view of the wafer). The central part of the wafer corresponds to the active part of the wafer that will actually be used to fabricate components. FIG. 11 thus shows that the tip of the blade that penetrated between the parts of the wafer is no longer in physical contact with the wafer, the contact between the blade and the wafer being limited to the portion with width dl of the constant thickness portion. This constant thickness of the back portion of the blade will be defined as a function of the type of wafer to be cut; for example, it may be of the order of 5 millimeters.

Figure 2B:
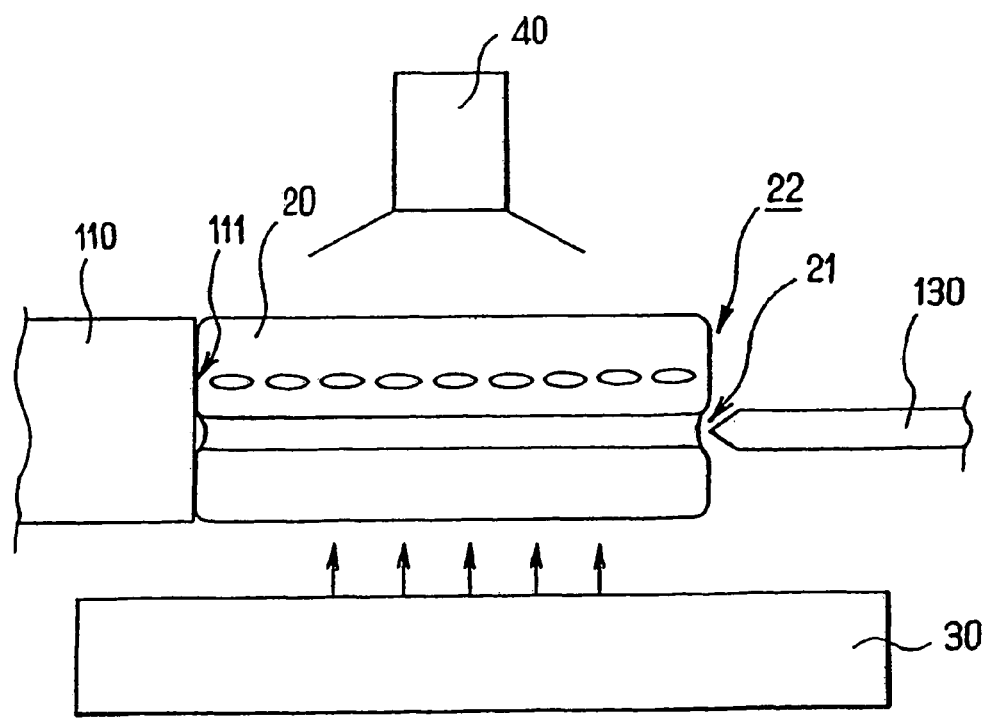
Figure 3:
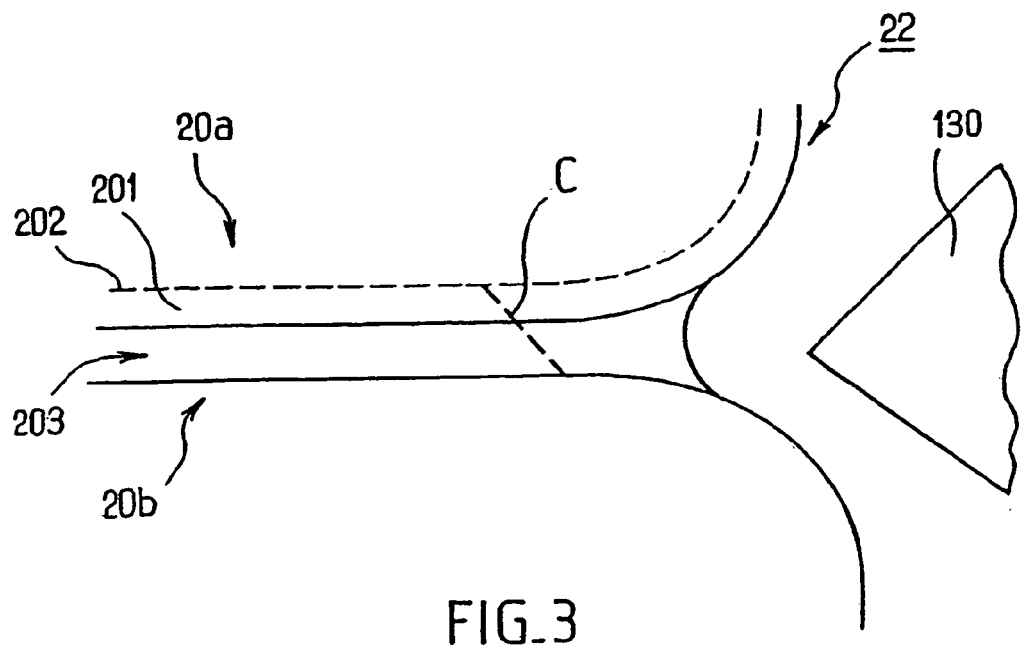
FIG. 3 is an enlarged, diagrammatic elevational view of the side of a blade that could be used in a device like that shown in FIG. 1 and a portion of a wafer about to be cut by the blade.

The purpose of the blade is to cut the wafer, as defined above to divide it into two separate parts (actually the two parts are the source substrate and the layer to be pulled off), and to guarantee that the said parts do not combine together again after this division. Consequently, the front section of the blade is beveled, as shown in FIGS. 2a, 2b and 3. In particular, a preferred use of the device according to the invention is illustrated with reference to these figures. It is to be noted, however, that these diagrammatic figures are shown for illustrative purposes only, and that they are not to scale with respect to actual wafers or with regard to the different elements shown (wafer layers, blades, and other elements of the device, etc.).

These diagrammatic figures show that the sidewall 22 of the wafer 20 that is shown is not absolutely straight, but comprises an annular notch corresponding to the chamfer 21. This annular notch is produced by bringing together the rounded edges of two parts 20a and 20b of the wafer that were bonded by any known process (molecular bonding or some other type of bonding) to form the wafer 20. The annular notch 21 corresponds to the bonding interface 203 between the two parts 20a and 20b.

According to standards in force, the edges of the semiconductor wafers must not be sharp, to limit damage to them during an accidental shock. Thus, parts 20a and 20b (which themselves form "wafers" when considered independently) respect these standards and their edges are rounded or chamfered. The wafer shown also correspond to a preferred use, in which a thin layer 201 is cut by attacking the wafer with the blade 130 close to a weakened area 202. More precisely, the wafer 20 illustrated in these figures was made so that the bonding interface 203 between the two parts 20a and 20b is in the immediate vicinity of the weakened area 202. In this case, the tip of the blade 130 preferably attacks the wafer 20 at the bonding interface associated with an annular notch 21 that has a concave section which forms a chamfer.

According to one advantageous aspect of the invention, as the blade 130 moves in translation along the horizontal direction F, cooperation between the shape of the tip of the blade (usually convex, for example beveled) and the shape of the chamfered annular notch (usually concave) enables self-adjustment of the height of the wafer with respect to the blade. Thus, during the cutting operation, the wafer is free to move along the vertical direction. As can be seen in FIG. 2a, there is nothing to limit upwards wafer movements. The same is true for downwards wafer movements because as soon as the blade has started to attack the wall of the wafer, the movable part of the horizontal chassis 102 will be pulled back to leave the wafer completely free in the vertical direction. Consequently, as soon as the blade starts to engage the sidewall of the wafer in the immediate vicinity of the bonding interface 203, cooperation of the shapes of the blade and the notch mentioned above causes self-adjustment of the position of the tip of the blade facing the center of the interface.

Note that the initial attack height of the blade is adjusted in advance, so that it is approximately facing this interface. Therefore, more precisely, and with reference to FIG. 3, the blade 103 initially attacks the sidewall of the wafer in the immediate vicinity of the bonding interface 203, in order to cause cooperation between the shapes of the slopes of the bevel of the blade and the slopes of the annular notch of the chamfer 21. Note that the thickness of the leading edge of the blade (in other words the thickness of the terminal section of the blade by the radius of curvature of the tip of the blade) is on the order of ten microns, or more. The blade itself may be on the order of a few millimeters thick. Furthermore, the distance between the bonding interface 203 and the weakened area 202 is very much less than the dimensions of the blade. Thus, as the blade attacks the sidewall of the wafer, the geometry of the bevel of the leading edge of the blade produces a wedge effect that separates the parts of the wafer on either side along the vertical direction perpendicular to the cutting plane.

The path of the vertical stresses that separate the two parts of the wafer from each other naturally lie in the immediate vicinity of the weakened area 202. This transfer of vertical stresses to the weakened area 202, in the region facing the bonding interface 203 towards the weakened area 202, is illustrated in FIG. 3 by the constraint line C. The constraint line C diagrammatically represents the cut line between the two parts of the wafer in the vicinity of the edge of the wafer. When this line C reaches the weakened area 202, and continues towards the inside of the wafer (in other words towards the left in FIG. 3), the cut line becomes coincident with the weakened area 202. This weakened area 202 represents a "well" for the stresses, and since the wafer is free to move along the vertical direction, the self-adjustment mentioned above continues to allow the blade to continue its penetration into the wafer at the chamfer 21.

The blade is not in contact with the wafer except for a predetermined limited depth within the wafer. This depth is of the order of a few millimeters and corresponds to the inactive portion of the wafer ("exclusion area"). Thus, the geometry of the blade is such that the blade does not act as a "cutting" tool that would "cut" the wafer (the "cut" was defined above, and does not correspond to a slicing effect). In reality, the internal angle of the bevel of the blade needs to be small enough so that the blade actually penetrates into the wafer, but it must also be large enough so that the blade actually performs its function as a wedge that penetrates between the layer 201 to be transferred and the rest of the wafer. Once the blade has began to penetrate into the wafer, the sloping edges of its leading edge separate the layer 201 from the rest of the wafer along the vertical direction. The leading edge could have a vertex angle on the order of 60°. This enables propagation of a cleaving wave or a separation wave of the layer 201 over a large part or possibly the entire surface of the wafer (although the blade only penetrates to a limited depth into the wafer).

It will be noted that since there is no element that limits movements of the wafer either upwards or downwards in the vertical direction, then the wafer can not only automatically adjust its position along the vertical direction when the blade is brought into action, but can also deform freely and symmetrically during the separation phase. This facilitates smooth execution of the cut, and reduces the risks of deterioration of the layer 201 and the substrate, particularly when the substrate 20b is made of a brittle material such as quartz.

The blade is made from a fairly hard, smooth material that is capable of penetrating into the wafer but not too hard to avoid damaging the surfaces of the layer 201 and the substrate. For example, the blade could be made from a material such as polyvinyl chloride (PVC) or polyetheretherketone (PEEK), or Teflon®. The blade must also be thick enough to keep the layer 201 sufficiently separated from the rest of the wafer and to guarantee that the separation wave of the layer 201 propagates effectively over most of the surface of the wafer. It has been determined that a thickness on the order of 5 millimeters is suitable for this purpose.

Figure 4:
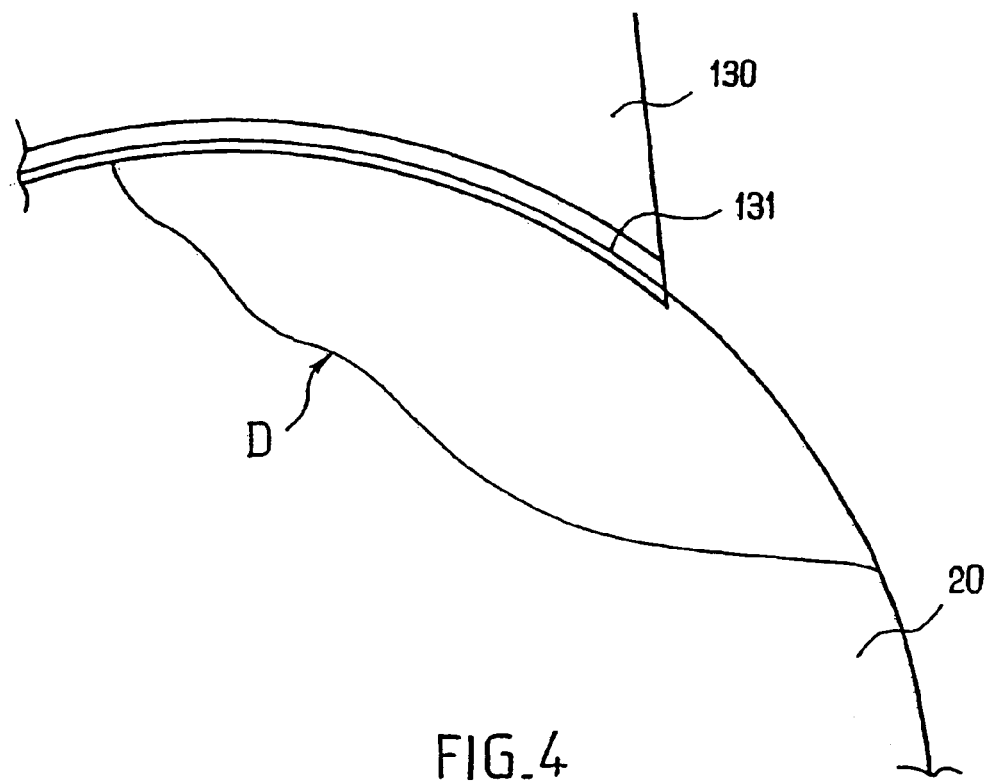
FIG. 4 is an enlarged, diagrammatic top view of the leading edge of a blade that could be used in a device like that shown in FIG. 1, close to the wafer attack area.

FIG. 4 shows a separation wave D of the layer 201, observed close to the edge of the blade, for the device 10 that corresponds to the first embodiment of the invention as described above. The separation wave can be defined as being a waver front observed when the wafer is divided into two parts, and that demarcates the line along which the layer 201 divides from the rest of the wafer. In this respect, FIG. 2b shows an advantageous variant of the invention, in which progress of the separation wave of layer 201 is continuously displayed by use of a light source 30 (for example an infrared lamp) placed under the wafer and aimed at it, and a camera 40 located on the other side of the wafer to collect light transmitted through the wafer. The light source can be brought to face the wafer only after the central part 102 of the fixed chassis has been retracted. A part 102 transparent to radiation output from source 30 can also be used.

Since there is no support element facing the principal faces of the wafer, it is possible to observe the separation wave under excellent conditions. This is not the case with conventional automatic devices that include holding elements that hold the principal faces of the wafer in position.

It is also possible to control the movement of the blade displacement support 120 based on the observations made by the camera 40, by providing a displacement regulation loop to obtain controlled progress of the separation wave. This aspect of controlling the displacement of cutting means of the device will be described in more detail later in the remainder of the text with reference to a second embodiment of the invention. The displacement support can also be programmed to enable continuous translation of the blade. This is particularly useful when the structure of the wafer is simple. However, in the case of a wafer made from a large number of layers that are bonded together, it may be preferable to move the blade forward intermittently (the regulation means mentioned above will advantageously be used in this case as well).

In the case of a wafer made on a transparent lower substrate 20b (for example quartz), the camera 40 may be placed directly under the wafer (at the location of the source 30 in FIG. 2b). The camera can then monitor the separation through the transparent lower substrate.

The single shim 110 of FIG. 1 may be replaced by an assembly of shims that include several fixed shims. The shims block the wafer in the horizontal cutting plane but allow it to freely move in the vertical direction.

If the present device is used on a wafer without an annular chamfer, it will be possible to form a concave-shaped notch in the wall of the wafer facing the location at which the leading edge of the blade will attack the wafer. This notch with cooperate with the blade as discussed above, so that the self-adjustment also described above can be achieved. It is also possible to provide several blades mounted on the same displacement support, or mounted on corresponding displacement means independent of each other. An embodiment of this aspect of the device will also be described with regard to a second embodiment below.

In a simplified version of the device, the means for displacing the blade or blades may be activated by manual devices, such as a crank handle. In any case, it is preferable to generate a single separation wave when the blade(s) is (are) attacking the wafer, because problems can arise at the junction of two different waves that were initiated at different locations around the periphery of the wafer and that propagate in different directions. Thus, if several blades are provided, a suitable configuration is the configuration in which one blade moves forward in advance as the tip, the others taking over the attack of the first blade behind it and at its sides, so that they contribute to the propagation of the same separation wave initiated by the first blade.

However, it is not essential that the wafer should initially be attacked at its mid-point (on the longitudinal axis of the device that joins the center of the blade and the center of the shim). The blade may have an asymmetric contour with a tip that moves forwards on one side only, and that attacks one side of the wafer before the other side. It is also possible that the blade is fixed and that the shim is mobile. But in any case, one of the two elements must be mobile. And in all cases, the provision for self-adjustment of the position of the wafer mentioned above will be advantageously used.

It is possible to use a pressure sensor or a force sensor with the blade, in order to monitor forces applied to the blade during the cut. The advance of the blade (or of the mobile element) can also be regulated as a function of these forces. This regulation may be used in combination with the regulation as a function of the separation wave described above, or as alternative regulation.

Figure 5B:
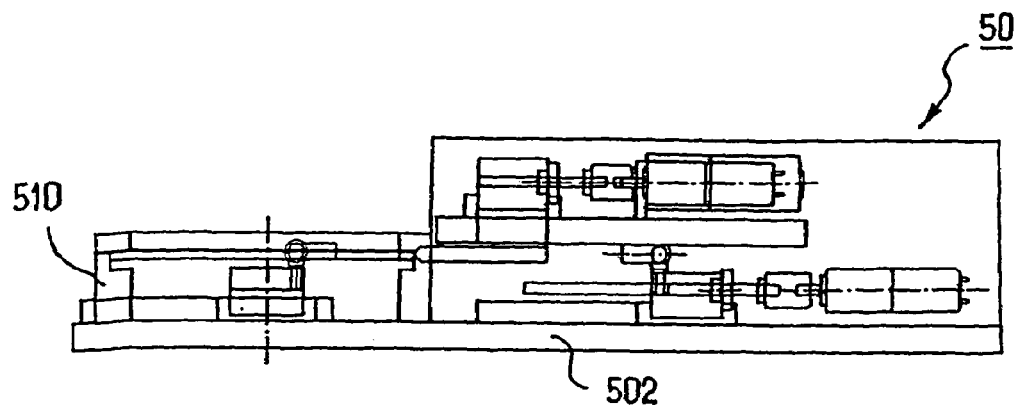
FIGS. 5a and 5b show a top view and a side view, respectively, of a second embodiment of a cutting device according to the invention that includes cutting means with additional blades that are used in successive phases.
Figure 5A:
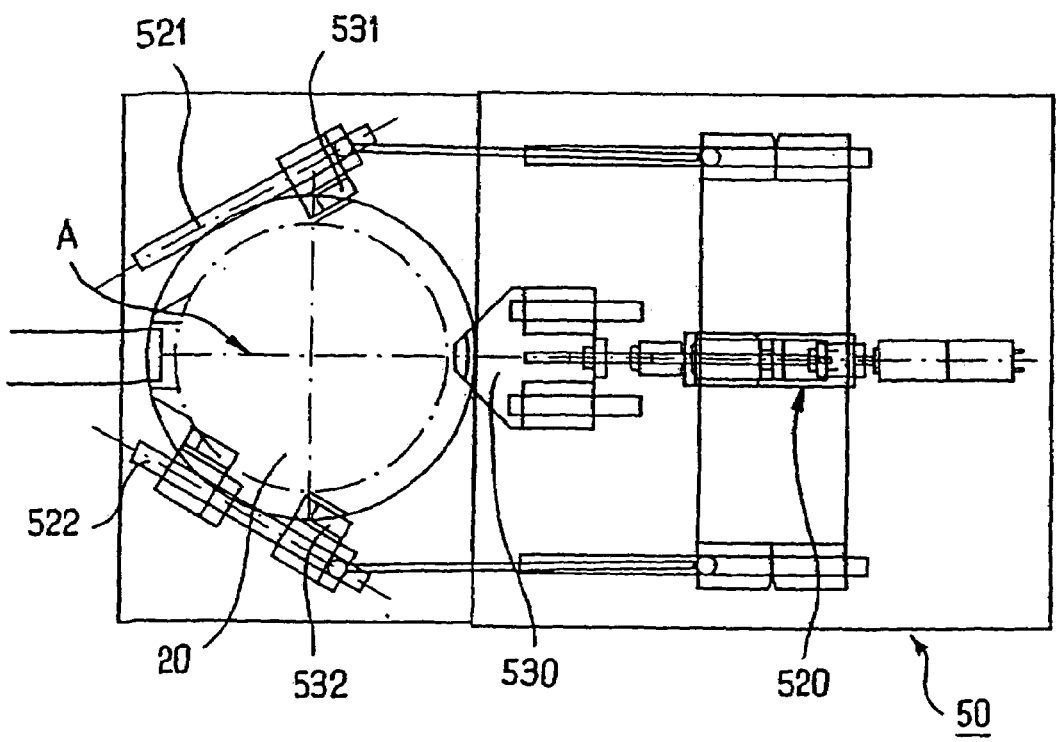

FIGS. 5a and 5b, 7, 8 and 10 show a second embodiment of a device 50 designed to cut an edge of a wafer 20. FIGS. 5a and 5b are diagrammatic top and side views on which a shim 510 and a first blade 530 is supported by displacement means 520 that moves the first blade mobile with respect to the shim. The first blade and shim are shown around the wafer 20 in a manner similar to the configuration of the device 10 described above. The shim 510 shown in the left part of FIG. 5b is fixed, and blade 530 can be brought towards the wafer to attack the wafer. The wafer is preferably arranged between the shim 510 and the blade 530 so that these three elements are in line along an axis that corresponds to the direction of displacement of the blade 530.

Figure 7:
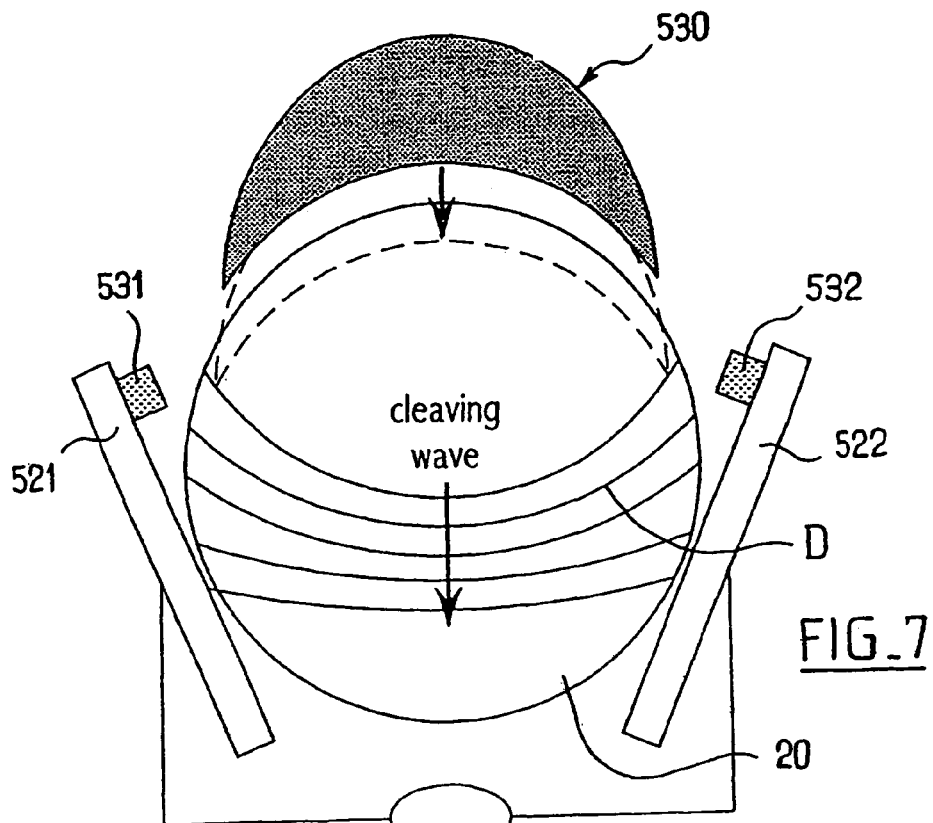
FIG. 7 is an enlarged, detailed diagrammatic top view of the cutting means of the device shown in FIGS. 5a and 5b, illustrating cutting of a wafer layer in a first position corresponding to a first phase of the cutting operations.
Figure 8:
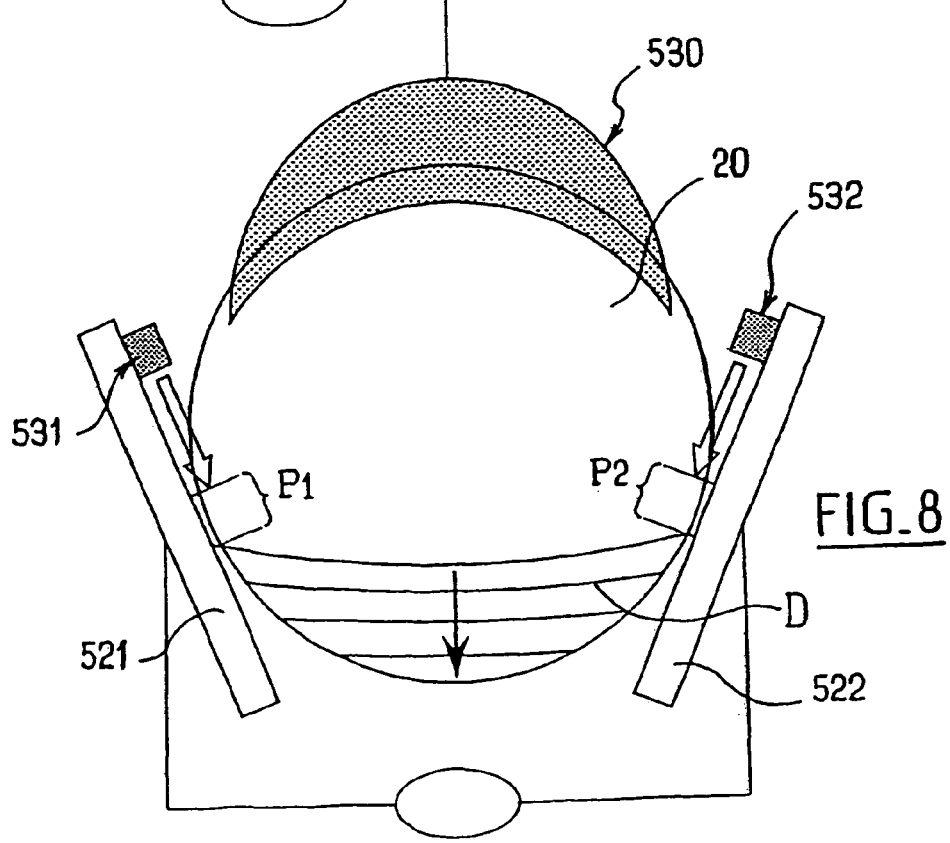
FIG. 8 is an enlarged, detailed view similar to that of FIG. 7, in which the cutting means are in a second position corresponding to a second phase of the cutting operations.

It can be seen in FIG. 5a that the shape of the blade 530, unlike the device 10 described above, is such that a large part of the periphery of the wafer cannot be attacked. The geometry of this blade 530 as seen in the top view has a delta shape, one vertex of which is facing the wafer to attack it (the "vertex" of the delta being truncated so as to attack a small part of the periphery of the wafer). With reference to FIGS. 7 and 8, it can be seen that the geometry of the leading edge of this first blade 530 can also be circular, as in the case of the blade 130 of the device 10.

According to one particular aspect of this second embodiment, the cutting means of the device 50 comprise a second cutting device, in addition to the first blade 530 which forms a first cutting device. This second cutting device includes two blades 531 and 532 placed on each side of the median axis of the wafer that is parallel to the displacement direction of the blade 530 (axis A shown in FIG. 5a). Each of these blades 531 and 532 is designed to engage the wafer 20 in a second phase of the cutting operation, after engagement of this wafer by the first blade 530 corresponding to a first phase. Consequently, the blade 531 is carried by displacement means 521 to displace the blade along a trajectory that enables it to attack wafer 20 at a distance from the part at which the first blade 530 attacks it, on a first side of the wafer relative to the direction A of attack of the first blade. The displacement means 521 ma7 also allow a continuation of the attack around the wafer periphery. The second blade 532 is supported by displacement means 522 on the other side of the axis A, in a symmetrical arrangement.

In the view shown in FIGS. 5a, 5b, 7 and 8, the two displacement means 521 and 522 are arranged so as to displace the blades 531 and 532 along two symmetric straight line sections that converge towards the median longitudinal axis A of the wafer. In this second embodiment, the first cutting device (blade 530, or any blade assembly comprising at least one blade) attacks the wafer 20 during a first cutting phase. A sensor monitors progress of a parameter representing the cutting operation performed by the first blade 530. The second cutting phase will be automatically triggered by appropriate control means, as a function of signals output from this sensor.

The second phase corresponds to use of the second cutting device (the two blades 531 and 532 in the example illustrated here). It should be understood, however, that the second cutting device could be in the form of an assembly that includes an arbitrary number of blades. The second cutting device is only started after the parameter reaches a predetermined value that represents the cutting operation performed by the first blade 530, which is contained in a memory of the second cutting phase trigger device. In particular, this parameter representing the cutting operation of the first blade 530 may be related to the observed spacing between the two parts of the wafer for it may be the value of the spacing itself). In this case, the second cutting device begins cutting after a given spacing between the two parts of the wafer occurs. It is also possible to use additional or alternative parameters representing the cutting operation performed by the first blade 530 (for example, the progress of the separation wave). Thus, any type of optical, mechanical or other type of sensor can be used to characterize the progress of the separation caused by the attack of the first cutting device, or to monitor the spacing between the layer to be cut and the rest of the wafer. In all cases, the second phase will only be triggered when the parameter(s) representing progress of the cutting operation of the first phase will have reached one or more predetermined values.

If a camera is used as a sensor, it may be an infrared camera, for example, located under a quartz window under the wafer 20. This type of window is shown in FIG. 5b as reference 502. The camera could also be an optical camera operating at a different wavelength. This adaptation of the camera characteristics will be made particularly as a function of the nature of the source substrate of the wafer from which the layer to be detached.

It would also be possible to use a force sensor associated with the first blade 530 in combination with the sensor mentioned above. In all cases, the sensor monitoring the parameter(s) representing progress of the cut during the first phase will be sufficient to trigger the second phase. And the signal(s) from the sensor or sensors may also be used to regulate progress of the second cutting device during the second phase.

Note that the first cutting device may be fixed in place during this second phase, so that a wedge effect continues to occur between the parts of the wafer that it attacked. In one variant, it is also possible that the first cutting device will continue its attack on the wafer during the second cutting phase. In this case, the first and second cutting devices work in cooperation during the second phase. Thus, in one preferred embodiment of the invention, it is possible to control displacement of the first blade 530 in an initial step, such that it attacks the wall of the wafer all by itself.

Note that the displacement velocity of the blade is precisely controlled during the first cutting phase. Typically, this velocity will be between 0.5 and 5 mm/second.

It is also possible to superpose additional means on the sensor that triggers the second phase, to check that each cutting phase takes place smoothly. Thus, a force measurement system or a blade displacement velocity measurement system can be used while the first blade is attacking the wafer during the first phase. In this case, the force applied by the first blade as it attacks the wafer, and/or its advance velocity, can be continually varied during the first phase, so that this first phase can be carried out under optimum conditions.

It would also be possible to use measurements from the sensor that triggers the transition between the first and second phases, to precisely control displacement of each blade during the phase associated with the particular blade. The fact that two cutting devices are implemented sequentially, with the passage from the first means to the second means being controlled by a measurement representing progress of the cut during the first phase, means that the separation wave can be made to advance from one end of the wafer to the other under optimum conditions. This also provides a way to prevent the formation of several separation waves.

Figure 6:
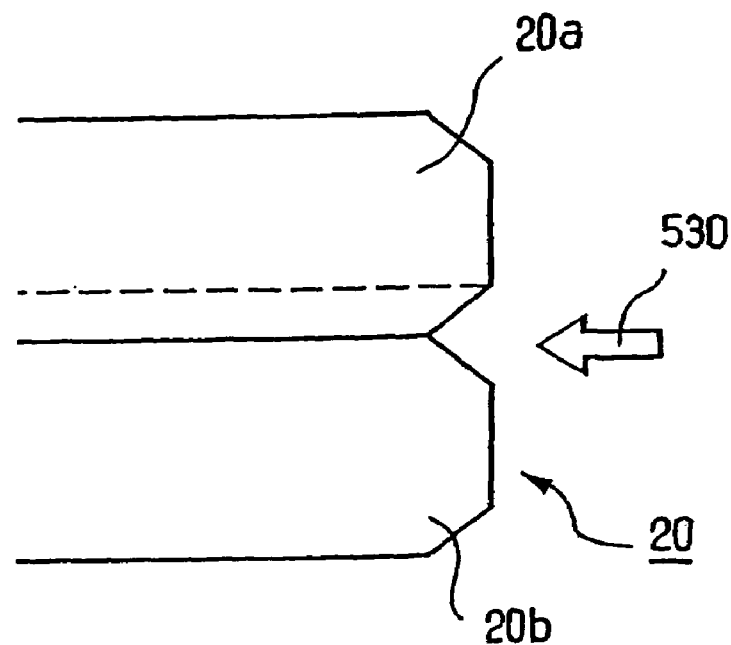
FIG. 6 is a side view similar to that shown in FIG. 3, that diagrammatically illustrates the interfaces of a wafer on which a cutting operation is to be carried out.

FIG. 6 illustrates the position of the blade 530 with respect to the bonding interface of a wafer that is to be cut. Once again, the blades of the two cutting means will be positioned approximately facing the bonding interface. And once again, after the attack by the first blade, the support placed under the wafer will be retracted so that the wafer is free to move along the vertical direction and thus to enable the self-adjustment mentioned above.

FIGS. 7 and 8 diagrammatically illustrate a top view of the two cutting devices during the two cutting phases. In FIG. 7, the displacement means associated with the first blade 530 brings the blade into contact with the wafer 20 to attack its wall and to generate a separation wave D (for which several successive positions are shown in this figure and in FIG. 8). As can be seen in the figure, the blade 530 may have a "crescent" shape with a curved leading edge to attack the wafer over a continuous part of its periphery. An appropriate sensor follows the progress of this separation wave D, and/or any other parameter representing the progress of this first cutting phase. As shown in FIG. 8, the second cutting device (and therefore the second cutting phase) is activated when the signals output from this sensor reach a predetermined threshold value. As mentioned above, the second phase can also be triggered under the control of signals output by different sensors representing different aspects of progress of the first phase. In this case, one or several composite signals generated from elementary signals from the different sensors can be used.

As illustrated in FIG. 8, during the second phase the first blade 530 can be immobilized and remain in the position reached at its maximum advance point during the first phase, while the second cutting device is activated. In the case described here, this second cutting device comprises the two blades 531 and 532 that are moved by the corresponding means 521 and 522 to attack the wafer in turn along a controlled trajectory. Progress of the blades can be controlled during each phase by signals output from a force sensor, in order to avoid applying excessive force to make the blades penetrate into the wafer, to minimize the risk of damaging the wafer. The separation wave D continues to progress under optimum conditions as a result of the attack made during the second phase.

FIG. 9 provides additional information about the configuration of the blades in the second cutting device, wherein these two blades are identical. Note also that the two blades are moved symmetrically with respect to the longitudinal A axis of the wafer, by their corresponding displacement means that are controlled together. In this figure, the blade 532 slides in two rails 5321 and 5322 that guide the trajectory of the blade.

In the configuration in FIG. 9 in which the rails are vertical (in other words are in the direction perpendicular to the cutting plane of the wafer), this blade also forms a right angle such that its leading edge is oriented parallel to the horizontal cutting plane in which the blade is guided by the rails. It is also possible that the rails could be placed one above the other, so as to support the blade 532 in its horizontal cutting plane. In this case, the rails are turned towards the wafer and the blade 532 does not contain a right angle elbow. The blade 532 is capable of attacking the wafer tangentially, following it continuously around a portion P2 of its periphery (the blade 531 still being able to attack the wafer at a symmetrical portion P1 of its periphery).

FIG. 9 shows a preferred embodiment of the blade 532, shown as a cross-section. In this figure, the shape of the cross-section of the leading edge 5320 of the blade is rounded (the cross section corresponding to the cross-hatched part of the blade in FIG. 9), so that this blade can penetrate into the wafer without any risk of causing damage to it. Note that this blade 532 does not penetrate into the wafer until the two parts of the wafer have been separated by the first blade 530. Thus, the blade 532 does not perform a function to initiate separation, it simply advances the separation initiated by the first blade. Furthermore, the shape of the blade 532 as seen from above may also be circular (corresponding to a vertical downwards view of the blade 532 along the direction of the arrow V in FIG. 9). Thus, FIG. 10a shows a top view of a blade 532 for which the shape of the leading edge is circular in this view.

If a blade 532 with a rectangular-shaped top view (or any other shaped top view with sharp edges) is used, there is a risk of attacking the wafer with the side edge 53210 of such a blade that is at the front of the blade displacement, or with the side wedge 53211 between the said lateral edge and the part of the blade that actually forms the leading edge (see FIG. 10b).

The description concerning the first embodiment, particularly with regard to the wafers to be cut, their chamfers, the geometry of the leading edge of the blades and the self-adjustment of each blade and the wafer itself during the attack by each blade, and the assembly of shims (in this case shim 510), are equally applicable to this second embodiment. In a variation, the shim 510 may be moveable during the first cutting phase and/or the second phase, when some blades are fixed.

FIG. 11 diagrammatically shows a perspective view similar to the view of FIGS. 3 and 6, on which a blade 530 has been diagrammatically shown. It is noted that if the blade can penetrate to a depth (d1+d2) during the cut equal to approximately 7 mm, this depth does not correspond to the length dl of the contact area between the blade and the "internal" walls of the wafer. This contact length is typically only about 2 mm, while the beveled part of the tip of the leading edge can penetrate by a length d2 equal to approximately 5 mm, without causing any contact between the blade and the wafer.

After initial penetration of the blade into the wafer (during which the pointed tip of the leading edge is actually in contact with the wafer), thus only the constant thickness part of the blade is in contact with the wafer over a contact length of about 2 mm. This contact maintains a controlled spacing between the parts of the wafer that are to be cut. The length d1 of this part is equal to approximately the depth of the wafer exclusion zone that is the peripheral superficial area of the wafer that can include some small defects. Thus during the cut, and after the initial penetration, the blade only cooperates with the wafer in its exclusion area (in which there is no risk of damaging useful regions deeper in the wafer). Thus, high precision cutting assemblies that operate automatically can be manufactured in each of the two embodiments.

Obviously, the devices described above may be used to cut wafer layers for any purpose. Layers could be cut to be transferred onto a target support as mentioned above, or layers that had been bonded together can be cut (for example to recondition layers to which access is again required, so that these layers can then be bonded together again after reconditioning).

What is claimed is:

1. An automatic high-precision cutting method for separating a layer of material from a source substrate comprising:
providing a semiconductor substrate having a weakened area, an upper face, a lower face, a sidewall and a notch in the sidewall, wherein the notch is located a distance from the weakened area;
positioning at least a first portion of the sidewall of the semiconductor substrate against a fixed positioning member which maintains the substrate in a predetermined position on a support;
contacting at least a second portion of the sidewall of the semiconductor substrate with at least one blade, the semiconductor substrate being held between the positioning member and the at least one blade and being unsupported at the upper and lower faces; and
forming a cleaving wave in the substrate, wherein the cleaving wave is of sufficient intensity to both divide the substrate at the notch into first and second parts and detach the layer from the substrate along the weakened area.

2. The method of claim 1 which further comprises self-adjusting the relative positions of the substrate and the at least one blade along a direction perpendicular to the cutting plane as the blade contacts the notch, by cooperation between a cutting edge of the blade and the notch.

3. The method of claim 1 which further comprises monitoring the progress of the cleaving wave by analyzing light transmitted through the semiconductor substrate.

4. The method of claim 3 which further comprises controlling the movements of the at least one blade with a displacement device depending on the monitored progress of the cleaving wave.

5. The method of claim 1 which further comprises monitoring at least one parameter representative of the progress of a cutting operation of a first cutting device during a first cutting phase, and controlling a second cutting device during a second cutting phase as a function of the monitored parameter.

6. The method of claim 1 which further comprises attacking the substrate at a first location with a first cutting blade, and attacking the substrate at a second location a distance apart from the first location with at least a second cutting blade.

7. The method of claim 6 wherein the notch is annular and further comprising attacking the substrate at a third location with a third cutting blade, wherein the first, second and third cutting blades are arranged symmetrically about the annular notch of the semiconductor substrate.

8. The method of claim 1 which further comprises viewing the progress of the cleaving wave with a sensor through a transparent window located in the support.

9. An automatic high-precision cutting method for separating a layer of material from a source substrate comprising:
providing a semiconductor substrate having a weakened area, a sidewall and a notch in the sidewall, wherein the notch is positioned away from the weakened area;
positioning at least a portion of the sidewall of the semiconductor substrate against a fixed positioning member while supporting the substrate on a support;
contacting at least one blade with the notch of the semiconductor substrate to induce a cleaving wave into the substrate, the cleaving wave being of sufficient intensity to both divide the substrate at the notch into first and second parts and detach the layer from the substrate along the weakened area; and
moving at least a portion of the support away from the substrate as the blade contacts the notch so that the positioning member and blade are the only structures supporting the substrate.

10. The method of claim 9 wherein the positioning member is at least one shim oriented vertically with respect to the support and the support is a support substrate that is operatively associated with the positioning member so that the positioning member maintains the position of the semiconductor substrate in a cutting plane that is parallel to the at least one blade and the support member.

11. The method of claim 10 wherein the shim has a contour that corresponds to the contour of the semiconductor substrate and covers at least one quarter of the periphery of the substrate to hold the wafer when contacted by the blade and the at least one blade has a leading edge that has a contour that corresponds to the contour of the semiconductor substrate and covers at least one quarter of the periphery of the substrate.

12. An automatic high-precision cutting method for separating a layer of material from a source substrate comprising:
providing a semiconductor substrate with a first face, a second face, a side surface and a notch in the side surface;

forming a weakened area in the semiconductor substrate which is located a distance from the notch;

providing a fixed positioning member adjacent a first support;

positioning at least a portion of the side surface of the a semiconductor substrate on the first support and against the positioning member; and contacting the substrate with at least one blade to induce a cleaving wave into the substrate, the cleaving wave being of sufficient intensity to both divide the substrate at the notch into upper and lower parts and detach the layer from the substrate along the weakened area without limiting upward movement of the upper part of the wafer during cleaving, wherein the positioning member prevents movement of the substrate as the blade contacts the substrate, and wherein the substrate is held in position between the positioning member and the blade without any support contacting the first and second faces.

13. The method of claim 12 which further comprises self-adjusting the relative positions of the substrate and the at least one blade along a direction perpendicular to the cutting plane as the blade contacts the notch, by cooperation between a cutting edge of the blade and the notch.

14. The method of claim 12 which further comprises monitoring the progress of the cleaving wave by analyzing light transmitted through the semiconductor substrate.

15. The method of claim 14 which further comprises controlling the movements of the at least one blade with a displacement device depending on the monitored progress of the cleaving wave.

16. The method of claim 12 which further comprises monitoring at least one parameter representative of the progress of a cutting operation of a first cutting device during a first cutting phase, and controlling a second cutting device during a second cutting phase as a function of the monitored parameter.

17. The method of claim 12 which further comprises attacking the substrate at a first location with a first cutting blade, and attacking the substrate at a second location a distance apart from the first location with at least a second cutting blade.

18. The method of claim 17 wherein the notch is annular and further comprising attacking the substrate at a third location with a third cutting blade, wherein the first, second and third cutting blades are arranged symmetrically about the annular notch of the semiconductor substrate.

19. The method of claim 12, which further comprises supporting the substrate on a second support prior to contact by the at least one blade and moving the second support away from the substrate as the blade contacts the annular notch.

20. The method of claim 19 wherein the positioning member is at least one shim oriented vertically with respect to the second support and the second support is a support substrate that is operatively associated with the positioning member so that the positioning member maintains the position of the semiconductor substrate in a cutting plane that is parallel to the at least one blade and the first support.

21. The method of claim 12 which further comprises viewing the progress of the cleaving wave with a sensor through a transparent window located in the first support.

22. The method of claim 12 wherein the shim has a contour that corresponds to the contour of the semiconductor substrate and covers at least one quarter of the periphery of the substrate to hold the wafer when contacted by the blade and the at least one blade has a leading edge that has a contour that corresponds to the contour of the semiconductor substrate and covers at least one quarter of the periphery of the substrate.

\* \* \* \* \*